(12) United States Patent
Kitae et al.

(10) Patent No.: US 8,709,293 B2
(45) Date of Patent: Apr. 29, 2014

(54) FLIP-CHIP MOUNTING RESIN COMPOSITION AND BUMP FORMING RESIN COMPOSITION

(75) Inventors: Takashi Kitae, Osaka (JP); Seiji Karashima, Osaka (JP); Koichi Hirano, Osaka (JP); Toshiyuki Kojima, Kyoto (JP); Seiichi Nakatani, Osaka (JP); Shingo Komatsu, Osaka (JP); Yoshihisa Yamashita, Kyoto (JP)

(73) Assignee: Panasonic Corporation, Osaka (JP)

( * ) Notice: Subject to any disclaimer, the term of this patent is extended or adjusted under 35 U.S.C. 154(b) by 182 days.

(21) Appl. No.: 11/793,175

(22) PCT Filed: Dec. 14, 2005

(86) PCT No.: PCT/JP2005/022931
§ 371 (c)(1),
(2), (4) Date: Jul. 27, 2007

(87) PCT Pub. No.: WO2006/064831
PCT Pub. Date: Jun. 22, 2006

(65) Prior Publication Data
US 2008/0128664 A1 Jun. 5, 2008

(30) Foreign Application Priority Data
Dec. 17, 2004 (JP) ................................ 2004-365684

(51) Int. Cl.
*H01B 1/02* (2006.01)
(52) U.S. Cl.
USPC ........................................................ 252/512
(58) Field of Classification Search
USPC .......... 252/500, 512; 523/200, 455, 461, 466; 524/428
See application file for complete search history.

(56) References Cited

U.S. PATENT DOCUMENTS

| 4,457,861 | A | * | 7/1984 | DesMarais, Jr. | 252/512 |
| 5,145,532 | A | | 9/1992 | Fukunaga et al. | |
| 6,172,141 | B1 | * | 1/2001 | Wong et al. | 523/455 |
| 6,632,320 | B1 | * | 10/2003 | Takeichi et al. | 156/327 |
| 2001/0008310 | A1 | | 7/2001 | Sakuyama et al. | |
| 2001/0019075 | A1 | | 9/2001 | Abe et al. | |
| 2001/0020736 | A1 | * | 9/2001 | Nakazawa et al. | 257/678 |
| 2005/0060886 | A1 | * | 3/2005 | Tsukahara et al. | 29/846 |

FOREIGN PATENT DOCUMENTS

| EP | 1 050 888 | 11/2000 |
| EP | 1 615 263 | 1/2006 |
| EP | 1 796 155 | 6/2007 |
| EP | 1 796 156 | 6/2007 |
| JP | 1-157796 | 6/1989 |
| JP | 2-251145 | 10/1990 |
| JP | 6-125169 | 5/1994 |
| JP | 7-74459 | 3/1995 |
| JP | 9-27516 | 1/1997 |
| JP | 11-186334 | 7/1999 |
| JP | 2000-94179 | 4/2000 |
| JP | 2000-332055 | 11/2000 |
| JP | 2001-219294 | 8/2001 |
| JP | 2001-329048 | 11/2001 |
| JP | 2002-26070 | 1/2002 |
| JP | 2002-141367 | 5/2002 |
| JP | 2004-260131 | 9/2004 |
| WO | 98/14995 | 4/1998 |
| WO | 2004/070827 | 8/2004 |

OTHER PUBLICATIONS

M. Yasuda et al., "Self-Organized Joining Assembly Process by Electrically Conductive Adhesive Using Low Melting Point Fillers", $10^{th}$ Symposium on "Microjoining and Assembly Technology in Electronics", pp. 183-188, Feb. 5-6, 2004.
M. Rito et al., "Assembly Process by Electrically Conductive Adhesive Using Low Melting Point Fillers", $9^{th}$ Symposium on "Microjoining and Assembly Technology in Electronics", pp. 115-120, Feb. 6-7, 2003.
English Translation of Substantial Part of "Electronics Packaging Technology, Sep. 2000, pp. 38-45".
Y. Kaga et al., "Development of Soldering Technique through Super Solder", Technical Report of IEICE, EMD 96-15, (Jun. 1996), pp. 23-31.
K. Yasuda et al., "Self-Organized Packaging using Polymer Containing Low-Melting-Point-Metal Filler-Process Simulation of Viscous Multi Phase Flow Fluid", $11^{th}$ Symposium on "Microjoining and Assembly Technology in Electronics", pp. 239-244, Feb. 3-4, 2005.
T. Yamada et al., "Self-Organized Packaging by Polymer Containing Low Melting Point Metal-Experimental Verification of Process Rule Factors of Self-Organization",$11^{th}$Symposium on "Microjoining and Assembly Technology in Electronics", pp. 245-250, Feb. 3-4, 2005.
K. Ohta et al.,"Study of Self-Organization Assembly Process Based on MARS Method 3-Dimensional 2-Phase Flow Analysis", $12^{th}$ Symposium on "Microjoining and Assembly Technology in Electronics", pp. 381-386, Feb. 3-4, 2006.

(Continued)

*Primary Examiner* — Monique Peets
(74) *Attorney, Agent, or Firm* — Wenderoth, Lind & Ponack, L.L.P.

(57) ABSTRACT

There is provided a flip-chip mounting resin composition which can be used for a flip-chip mounting process that is high in productivity and reliability and thus can be applicable to a flip-chip mounting of a next-generation LSI. This flip-chip mounting resin composition comprises a resin, metal particles and a convection additive 12 that boils upon heating the resin 13. Upon the heating of the resin 13, the metal particles melt and the boiling convection additive 12 convects within the resin 13. This flip-chip mounting resin composition is supplied between a circuit substrate 10 and a semiconductor chip 20, and subsequently the resin 13 is heated so that the molten metal particles self-assemble into the region between each electrode of the circuit substrate and each electrode of the semiconductor chip. As a result, an electrical connection is formed between each electrode of the circuit substrate and each electrode of the semiconductor chip. Finally, the resin 13 is allowed to cure so that the semiconductor chip 20 is secured to the circuit substrate 10, which leads to in a formation of a flip chip assembly.

17 Claims, 14 Drawing Sheets

(56) References Cited

OTHER PUBLICATIONS

M. Toya et al., "Experimental Verification of Lateral Flow Effects in Resin Containing Solder Fillers on Self-Organization Joining Process", MES2006 (micro electronics symposium), pp. 335-338.

M. Yamashita et al., "Analysis Concerning the Coalescence Behavior of Metal Droplet in Self-Organization", $13^{th}$ Symposium on "Microjoining and Assembly Technology in Electronics" pp. 55-60, Feb. 1-2, 2007.

Supplementary European Search Report issued Jun. 12, 2012 in corresponding European Patent Application No. 05 816 822.0-2203.

Jong-Min Kim et al., "The Effect of Reduction Capability of Resin Material on the Solder Wettability for Electrically Conductive Adhesives (ECAs) Assembly", Materials Transactions, vol. 45, No. 3, Mar. 2004, pp. 793-798, XP55027920.

Jong-Min Kim et al., "New Electrically Conductive Adhesives Filled with Low-Melting-Point Alloy Fillers", Materials Transactions, vol. 45, No. 1, Jan. 2004, pp. 157-160, XP55028373.

Jong-Min Kim et al., "Isotropic Conductive Adhesives with Fusible Filler Particles", Journal of Electronic Materials, vol. 33, No. 11, Nov. 2004, pp. 1331-1337, XP55027923.

Kiyokazu Yasuda et al., "Self-Organized ACP Interconnection Using Wetting Property of Fusible Fillers", 2004 ICEP Proceedings, International Conference on Electronics Packaging, Tokyo, Apr. 14-16, 2004, pp. 135-140, XP009159566.

Songhua Shi et al., "Study on the Relationship Between the Surface Composition of Copper Pads and No-Flow Underfill Fluxing Capability", IEEE Transactions on Electronics Packaging Manufacturing, IEEE, Piscataway, NY, US, vol. 22, No. 4, Oct. 1999, pp. 268-273, XP011020001.

\* cited by examiner

Fig. 8

| Thermosetting resin |
|---|
| Bisphenol A type epoxy resin |
| Novolac type epoxy resin |
| Bisphenol F type epoxy resin |
| Phenol resin |
| Silicone resin |
| Melamine resin |

Fig. 9

| Thermoplastic resin | Glass transition Temperature (°C) |
|---|---|
| Polyethylene (PE) | -125 |
| Polypropylene (PP) | -20 |
| Polyamide (PA) | 57 |
| Polyvinyl chloride (PVA) | 80 |
| Polystyrene (PS) | 100 |
| Polycarbonate (PC) | 149 |
| Polyphenylene sulfide (PPS) | 85 |
| Polyethylene terephthalate (PET) | 69 |

Fig. 10

| Metal particle | Melting point (Solidus Temperature)(°C) | Particle diameter (μm) |
|---|---|---|
| Sn-58Bi | 139 | 20~45 |
| Sn-37Pb | 183 | 10~25<br>20~45 |
| Sn-9Zn | 199 | 20~45 |
| Sn-3.0Ag-0.5Cu | 217 | 2~3, 5~10<br>10~15, 10~25<br>25~35 |
| Sn-3.5Ag | 221 | 2~3, 5~10<br>10~15, 10~25<br>25~35 |
| Sn-0.7Cu | 228 | 20~45 |
| 12Sn-2.0Ag-10Sb-Pb | 240 | 20~45 |

Fig. 11

| Convection Additive | Boiling point (°C) | Convection Additive | Boiling point (°C) |
|---|---|---|---|
| Hexane | 69 | Dimethylamine-hydrochloride | 171 |
| Vinyl acetate | 72 | Dimethyl sulfoxide (DMSO) | 189 |
| Isopropyl alcohol | 83 | Ethylene glycol | 198 |
| Water | 100 | Butyl carbitol | 231 |
| 1,4-dioxane | 101 | N-methyl-2-pyrrolidone (NMP) | 204 |
| Butyl acetate | 126 | α-terpineol | 218 |
| Propionic acid | 141 | Butyl carbitol acetate | 246 |

Fig. 12

| Convection additive (Reactive diluent) | Boiling point (°C) |
|---|---|
| Tertiary carboxylic acid glycidyl ester (Carjura E) | 135 |
| Allyl glycidyl ether (AGE) | 154 |
| n-butyl glycidyl ether (BGE) | 165 |
| Glycidyl methacrylate (GMA) | 189 |
| Styleneoxide (SO) | 191 |
| Phenyl glycidyl ether (PGE) | 245 |

Fig. 13

| Convection additive (gas generation) | Decomposition temperature Gas generation temperature (°C) |
|---|---|
| Aluminum hydroxide | 230 |
| Calcium aluminate | 230 |
| Dawsonite | 230 |
| Boric acid | 70~ |
| Ammnonium metaborate | 120~ |
| Barium metaborate | 200~ |
| Azodicarbonamide (ADCA) | 197~210 |
| N,N'-dinitrosopentamethylenetetramine (DPT) | 200~250 |
| 4,4'-oxybis(benzenesulfonylhydrazide) (OBSH) | 155~165 |
| Sodium hydrogen carbonate | 120~150 |

FLIP-CHIP MOUNTING RESIN COMPOSITION AND BUMP FORMING RESIN COMPOSITION

This application is a U.S. national stage of International Application No. PCT/JP2005/022931 filed Dec. 14, 2005.

TECHNICAL FIELD

The present invention relates to a flip-chip mounting resin composition which can be used for a process for mounting a semiconductor chip over a circuit substrate. In particular, the present invention relates to the flip-chip mounting resin composition which can be used for the flip-chip mounting process that are high in productivity and thus can be used for a fine-pitch semiconductor chip. The present invention also relates to a bump forming resin composition which can be used for the fine-pitch semiconductor chip.

BACKGROUND of THE INVENTION

With a development of high density and high integration of a semiconductor integrated circuit (LSI) used for electronics device, higher pin count and finer pitch of connecting terminals of LSI chip have been rapidly developed in recent years. The LSI chip is mounted over a circuit substrate by generally employing a flip-chip mounting process in order to decrease wiring delay. It is common practice in this flip-chip mounting process to form solder bumps on the connecting terminals of the LSI chip, and then connect, through such solder bumps, all the connecting terminals to all electrodes formed on the circuit substrate in a batch process.

For mounting a next-generation LSI having 5000 or more connecting terminals over the circuit substrate, it is required to form fine-pitch bumps with its pitch of 100 μm or less. It is, however, difficult for a conventional solder bump forming process to form such fine-pitch bumps. Moreover, from a viewpoint that a large number of bumps must be formed according to the number of the connecting terminals, a high productivity is required for reducing a manufacturing cost by reducing mounting tact time per chip.

Conventionally, there has been developed a plating process and a screen printing process as a bump forming process. The plating process is convenient for achieving the fine pitch, but it is complicated and has to compromise the productivity. The screen printing process, on the other hand, has a high productivity, but is not convenient for achieving the fine pitch since a mask is used.

Recently, there has been developed several processes for selectively forming solder bumps on electrodes of the LSI chip or circuit substrate. These processes are not only convenient for forming fine bumps, but also convenient for achieving a high productivity since a plurality of the fine bumps can be formed in a batch process. Accordingly they are expected as promising processes that can be applicable to the mounting of the next-generation LSI over the circuit substrate.

According to one of these promising processes, there is a solder paste process (for example, see Japanese Patent Kokai Publication No. 2000-94179 which is hereinafter referred to also as "Patent literature 1"). In this process, a solder paste comprising a mixture of metal particles and a flux is applied directly onto a substrate having electrodes thereon, and subsequently the substrate is heated so as to melt the metal particles. As a result, the bumps are formed selectively on the electrodes having high wettability.

There is also another process called as a super solder paste process wherein a paste composition ("deposition type solder using chemical reaction") mainly comprising organic acid lead salt and tin metal is applied directly onto a substrate having electrodes thereon, and subsequently the substrate is heated so as to induce a displacement reaction for Pb and Sn, and thereby Pb/Sn alloy is selectively deposited on electrodes of the substrate. For example, see Japanese Patent Kokai Publication No. H01-157796 (which is hereinafter referred to also as "Patent literature 2").

Both of the solder paste process and the super solder paste processes involve local variations in thickness and concentration of the solder, because the paste composition is applied onto the substrate. This causes the deposition amount of the solder to differ from one electrode to another, and therefore their processes cannot form bumps which are all equal in height. As to such processes, the paste composition is applied onto the substrate of which surface is not smooth due to the electrodes formed thereon. As a result, less amount of the solder is supplied on the electrodes having a higher level than that of the substrate surface, and thus it is difficult to form the bumps with satisfactory heights required for the flip-chip mounting.

By the way, in a flip-chip mounting process employing a conventional bump forming technique, subsequent to mounting a semiconductor chip over a circuit substrate having bumps formed thereon, it is required that a resin (which is called "underfill") is poured into a clearance gap formed between the circuit substrate and the semiconductor chip so as to secure the semiconductor chip to the circuit substrate.

There has been developed a flip-chip mounting process using an anisotropic conductive material wherein opposing electrode terminals of a semiconductor chip and a circuit substrate are electrically connected to each other, and at the same time the semiconductor chip is secured to the circuit substrate. For example, see Japanese Patent Kokai Publication No. 2000-332055 (which is hereinafter referred to also as "Patent literature 3"). In this process, a thermosetting resin comprising electrically conductive particles is supplied between the circuit substrate and the semiconductor chip, and subsequently the semiconductor chip is pressed and at the same time the thermosetting resin is heated. As a result, the electrical connection between the electrode terminals of the semiconductor chip and the circuit substrate, and the securing of the semiconductor chip to the circuit substrate are concurrently achieved.

Patent literature 1: Japanese Patent Kokai Publication No. 2000-94179

Patent literature 2: Japanese Patent Kokai Publication No. H01-157796

Patent literature 3: Japanese Patent Kokai Publication No. 2000-332055

Patent literature 4: Japanese Patent Kokai Publication No. 2004-260131

Non-patent literature 1: 10th Symposium on "Microjoining and Assembly Technology in Electronics" Feb. 5-6, 2004, pp. 183-188

Non-patent literature 2: 9th Symposium on "Microjoining and Assembly Technology in Electronics" Feb. 6-7, 2003, pp. 115-120

DISCLOSURE OF THE INVENTION

Problems to be Solved by the Invention

However, in the case of the above flip-chip mounting process using the anisotropic conductive material, an electrical conduction between the opposing electrode terminals is achieved due to a mechanical contact through the electrically conductive particles, and thus a stability of the electrical conduction is hard to maintain.

Moreover, since the electrically conductive particles that are present between the opposing electrode terminals are retained by a cohesion attributable to the thermal curing of the resin, it is required to adjust elasticity modulus and thermal expansion coefficient of the thermosetting resin as well as to adjust particle size distribution of the electrically conductive particles, and therefore there is a problem in that the mounting process is hard to control.

That is to say, considering an applicability to the next-generation LSI chip having 5000 or more electrode terminals, the flip-chip mounting process using the anisotropic conductive material has lots of problems in terms of productivity and reliability.

Therefore, an object of the present invention is to provide a flip-chip mounting resin composition which can be used for the flip-chip process that is high in productivity and reliability, and thus can be used for the flip-chip mounting of the next-generation LSI.

Means for Solving the Problems

The present invention provides a resin composition for a flip-chip mounting, comprising:
a resin,
metal particles dispersed in the resin, and
a convection additive which is contained in the resin and boils upon heating of the resin
wherein, upon the heating of the resin, the metal particles melt in the resin and the boiling additive convects within the resin.

It is preferred that the content of the metal particles contained in the resin ranges from 0.5 to 30% by volume. It is more preferred that the content of the metal particles contained in the resin ranges from 0.5 to 20% by volume.

In a preferred embodiment, the resin is in paste form.

In a preferred embodiment, the resin is in sheet form and the resin becomes in a molten state upon the heating thereof.

It is preferred that the resin comprises thermosetting resin, a melting point of the metal particles is between a reaction-initiating temperature of the thermosetting resin and a curing temperature of the thermosetting resin, and
a boiling point of the convection additive is between the reaction-initiating temperature of the thermosetting resin and the curing temperature of the thermosetting resin.

It is also preferred that the resin comprises thermoplastic resin,
a melting point of the metal particles is above a glass transition temperature of the thermoplastic resin, and
a boiling point of the convection additive is above the glass transition temperature of the thermoplastic resin.

In a preferred embodiment, the resin comprises photosetting resin.

It is preferred that a boiling point of the convection additive is below a melting point of the metal particles.

It is preferred that the content of the convection additive contained in the resin ranges from 0.1 to 20% by weight.

In a preferred embodiment, the convection additive is at least one material selected from the group consisting of isopropyl alcohol, butyl acetate, butyl carbitol and ethylene glycol.

In a preferred embodiment, the flip-chip mounting resin composition is supplied between substrates which are opposed to each other, each of the substrates having a plurality of electrodes, and upon the heating of the resin composition the metal particles melt so that the molten metal particles self-assemble into region between each electrode of one of the substrates and each electrode of the other of the substrates to form a connection therebetween.

It is preferred that the content of the metal particles contained in said resin is defined by the following content percentage:

Content percentage of metal particles(% by volume)= [(total surface area of electrodes)/(surface area of substrate)×100±10].

In a preferred embodiment, each of the substrates has a plurality of electrodes that are arranged along the periphery of each of the substrates,
the content of the metal particles contained in the resin composition is 0.5% by volume and above.

In a preferred embodiment, each of the substrates has a plurality of electrodes that are arranged in lattice form on a surface of each of the substrates,
the content of the metal particles contained in the resin composition is 5% by volume and above.

In a preferred embodiment, one of the substrates is a circuit substrate, the other of the substrates is a semiconductor chip.

The present invention also provides a resin composition for forming a bump, comprising:
a resin,
metal particles dispersed in the resin, and
a convection additive which is contained in the resin and boils upon heating of the resin
wherein, upon the heating of the resin, the metal particles melt in the resin and the boiling convection additive convects within the resin.

It is preferred that the content of the metal particles contained in the resin ranges from 0.5 to 30% by volume. It is more preferred that the content of the metal particles contained in the resin ranges from 0.5 to 20% by volume.

In a preferred embodiment, the resin is in paste form.

In a preferred embodiment, the resin is in sheet form and the resin becomes in a molten state upon the heating thereof.

In a preferred embodiment, the bump forming resin composition is supplied onto a substrate which has a plurality of electrodes, and upon the heating of the resin composition the metal particles melt so that the molten metal particles self-assemble onto each electrode of the substrate to form a metal bump on each electrode of the substrate.

The present invention also provides a flip-chip mounting or bump forming resin composition comprising:
a resin,
metal particles dispersed in the resin, and
a convection additive which is contained in the resin and generates a gas upon heating of the resin
wherein, upon the heating of the resin, the metal particles melt in the resin and the gas generated from the convection additive convects within the resin.

In a preferred embodiment, the convection additive comprises a compound which contains crystallization water,
upon the heating of the resin, the convection additive is decomposed to generate water vapor.

In a preferred embodiment, the convection additive is at least one material selected from the group consisting of aluminum hydroxide, dawsonite, ammonium metaborate, barium metaborate, azodicarbonamide and sodium hydrogen carbonate.

In a preferred embodiment, the resin is in paste form or in sheet form.

The present invention also provides a flip-chip mounting or bump forming resin composition comprising:
a resin, and
metal particles dispersed in the resin, wherein the resin is capable of generating a gas upon a polymerization thereof when the resin is heated; and wherein, upon the heating of the resin, said metal particles melt in the resin and said gas generated from the resin convects within the resin.

In a preferred embodiment, the resin is at least one resin selected from the group consisting of polyester-based resin, polyamide-based resin and polyimide-based resin.

Effect of the Invention

The flip-chip mounting resin composition is supplied between the circuit substrate and the semiconductor chip wherein the electrodes of the circuit substrate and the electrodes of the semiconductor chip are arranged oppositely to each other. When the flip-chip mounting resin composition is heated, the metal particles dispersed in the resin are allowed to melt, and the molten metal particles are allowed to self-assemble into the region between each electrode of the circuit substrate and each electrode of the semiconductor chip. As a result, an electrical connection is formed between each electrode of the circuit substrate and each electrode of the semiconductor chip. In this case, the heating step allows the convection additive (which is contained in the resin) to boil and convect within the resin, and thereby the mobility of the metal particles are enhanced. This results in a uniform aggregation or agglomeration of the molten metal particles in the resin. The uniformly agglomerated metal particles are allowed to grow and self-assemble into the region between each electrode of the circuit substrate and each electrode of the semiconductor chip, these electrodes having high wettability. As a result, a high uniformity of the connections formed between the electrodes of the circuit substrate and the electrodes of the semiconductor chip is achieved.

Subsequent to the formation of the connection, the semiconductor chip can be secured to the circuit substrate by curing the supplied resin that is present between the circuit substrate and the semiconductor chip. In this way, a succession of steps can achieve not only an electrical connection between the electrodes of the semiconductor chip and the electrodes of the circuit substrate, but also the securing of the semiconductor chip to the circuit substrate, which will lead to a high productivity of the flip-chip mounting process.

Furthermore, the metal particles (which are dispersed in the resin) are provided with kinetic energy of convective motion of the boiling convection additives, and thereby the metal particles can effectively self-assemble into the region between the electrodes. As a result, it is possible to reduce the amount of the residual metal particles that have been left outside of each electrical connection. In particular, the residual metal particles can be substantially avoided by preliminary conforming the content of the metal particles contained in the resin to an optimum amount required for the formation of the electrical connections. As a result, electrical insulating properties can be improved at the region between the neighboring electrical connections, which will lead to an achievement of the fine pitch of the semiconductor chip.

In a case where some material which can generate a gas upon the heating of the resin is used as the convection additive contained in the resin, the gas generated from such material can convect within the resin. This means that the above advantageous effect of the boiling convection additive can be provided by the gas. In other words, the metal particles (which are dispersed in the resin) are provided with kinetic energy of the convective motion of the generated gas, and thereby the metal particles can effectively self-assemble into the region between the electrodes. As a result, a high uniformity of the connections is achieved.

Furthermore, in a case where, some material which can be polymerized to generate a gas upon the heating of the resin is used as the resin, the gas generated from such material can convect within the resin. This also means that the above advantageous effect of the boiling convection additive can be provided by this gas.

BRIEF DESCRIPTION OF THE DRAWINGS

FIG. 8 shows a table listing representative examples of thermosetting resin.

FIG. 9 shows a table listing representative examples of thermoplastic resin.

FIG. 10 shows a table listing representative examples of metal particles.

FIG. 11 shows a table listing representative examples of a convection additive.

FIG. 12 shows a table listing representative examples of a convection additive (reactive diluent).

FIG. 13 shows a table listing representative examples of a convection additive that is capable of generating gas.

Figure 1:
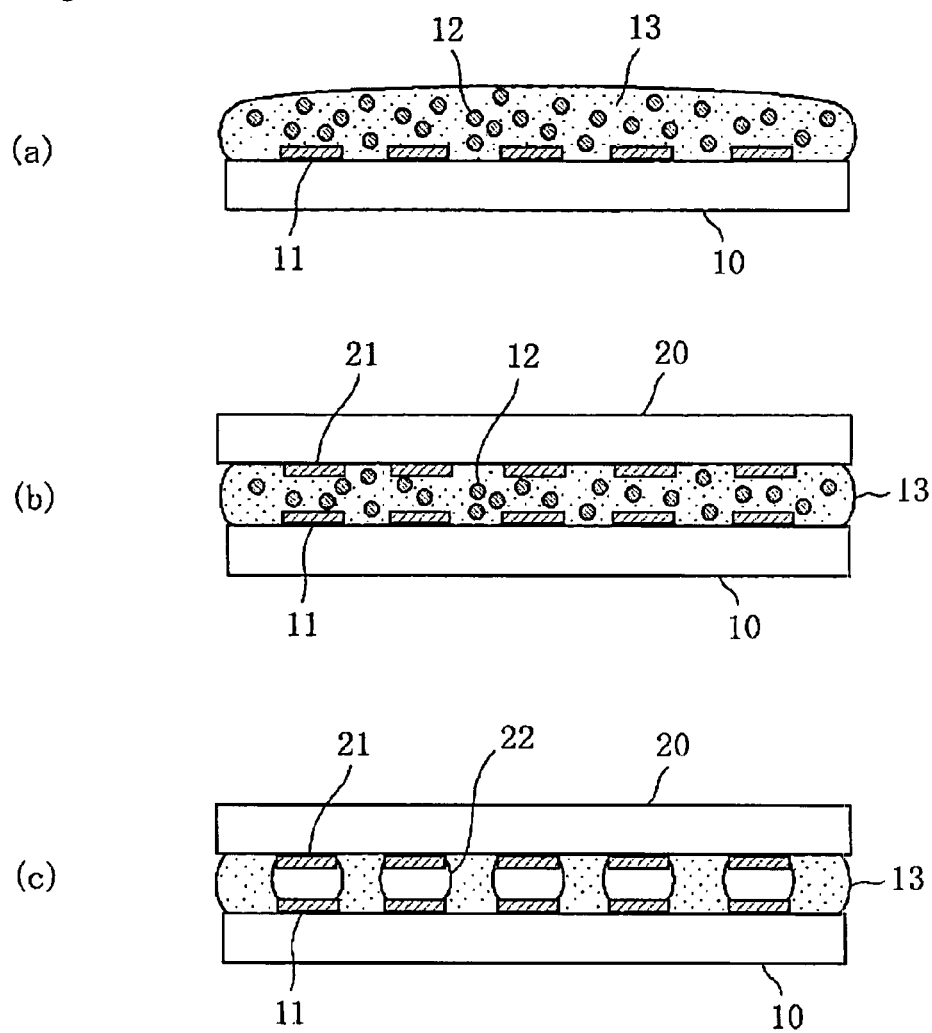
FIGS. 1(a) to 1(c) show cross-sectional views illustrating the steps in a flip-chip mounting process using a resin comprising a convection additive.

In the drawings, the reference numbers correspond to the following elements:
10: Circuit substrate (Circuit board)
11: Connecting terminal,
12: Convection additive
13: Resin
14: Flat plate
15: Bump
20: Semiconductor chip
21: Electrode terminal
22: Electrical connection
30: Interposer
31: Electrode terminal (land)

BEST MODES FOR CARRYING OUT THE INVENTION

The present applicant makes a study regarding the flip-chip mounting process that can be applicable to the next-generation LSI chip, and thereby proposes that a novel process for connecting the electrodes uniformly (see Japanese Patent Application No. 2004-267919).

FIGS. 1(a) to 1(c) show views illustrating the basic steps of the flip-chip mounting process disclosed in the above Patent application of the present applicant. As shown in FIG. 1(a), a resin 13 comprising metal particles (for example solder powder, not shown) and a convection additive 12 is supplied onto a circuit substrate 10 on which a plurality of connecting terminals 11 are formed.

Next, as shown in FIG. 1(b), a semiconductor chip 20 having a plurality of electrode terminals 21 is brought into contact with a surface of the supplied resin 13 such that the electrode terminals 21 of the semiconductor chip 20 are respectively opposed to the connecting terminals 11 of the circuit substrate 10. Subsequently the resin 13 is heated up such that the heating temperature of the resin 13 is above a melting point of the metal particles and a boiling point of the convection additive 12.

As a result of the heating, the molten metal particles are allowed to uniformly aggregate or agglomerate within the resin 13, and then self-assemble into the region between each connecting terminal 11 and each electrode terminal 21, the terminals 11 and 21 having high wettability. This leads to a formation of a connection 22 serving to electrically connect between each electrode terminal 21 of the semiconductor chip 20 and each connecting terminal 11 of the circuit substrate 10 (see FIG. 1(c)). Finally, the resin 13 is allowed to cure so that the semiconductor chip 20 is secured to the circuit substrate 10.

According to the above novel process, the convection additive 12 contained in the resin 13 boils by the heating of the resin, so that the boiling convection additive 12 is allowed to convect within the resin 13. This promotes a movement of the molten metal particles in the resin 13, which leads to a uniform aggregation or agglomeration of the molten metal particles. That is, the molten metal particles are allowed to grow uniformly and self-assemble into the region between each connecting terminal 11 and each electrode terminal 21, both of which have high wettability. This results in a high uniformity of the connections 22 formed between the connecting terminals 11 and the electrode terminals 21.

It is supposed that the resin 13 serves as "sea" wherein the molten metal particles are freely wafting and movable. Even so, the aggregation or agglomeration of the molten metal particles proceeds in a very small localized region since such aggregation or agglomeration completes in a very short period of time. In a case where the molten metal particles self-assemble onto the terminals 11 and 21 simply due to the wettability thereof, it is supposed that there occurs variability in that the metal particles which have locally aggregated or agglomerated self-assemble onto the terminals 11 and 21, thus making it impossible to obtain uniform connections 22.

Theses supposition led to an idea of forcibly moving the metal particles dispersed in the resin 13 to prevent the above variability and thus achieve the uniformity of the resulting connections 22 by providing the resin 13 comprising a convection additive, followed by forcibly convecting the additive within the resin 13.

The present invention provides a flip-chip mounting resin composition that is suitable for forming the uniform connections upon carrying out the process for producing the flip chip assembly as described above.

With reference to the attached drawings, a few embodiments of the present invention will be hereinafter described in more detail. It will be noted that the present invention will not necessarily be limited to the following embodiments.

Embodiment 1

The flip-chip mounting resin composition of the present invention comprises a resin as a main component, the metal particles dispersed in the resin, and a convection additive contained in the resin. The convection additive boils upon heating of the resin. This resin composition can be used for the flip-chip mounting process as shown in FIGS. 1(a) to 1(c), in which case, upon the heating of the resin, the metal particles melt and the boiling convection additive convects within the resin.

During the heating of the supplied resin 13 located between circuit substrate 10 and the semiconductor chip 20, the molten metal particles are allowed to self-assemble into the region between each connecting terminal 11 of the circuit substrate 10 and each electrode terminal 21 of the semiconductor chip 20. As a result, an electrical connection 22 is formed between each connecting terminal 11 and each electrode terminal 21. Finally, the resin is allowed to cure so that the semiconductor chip 20 is secured to the circuit substrate 10.

Figure 2:
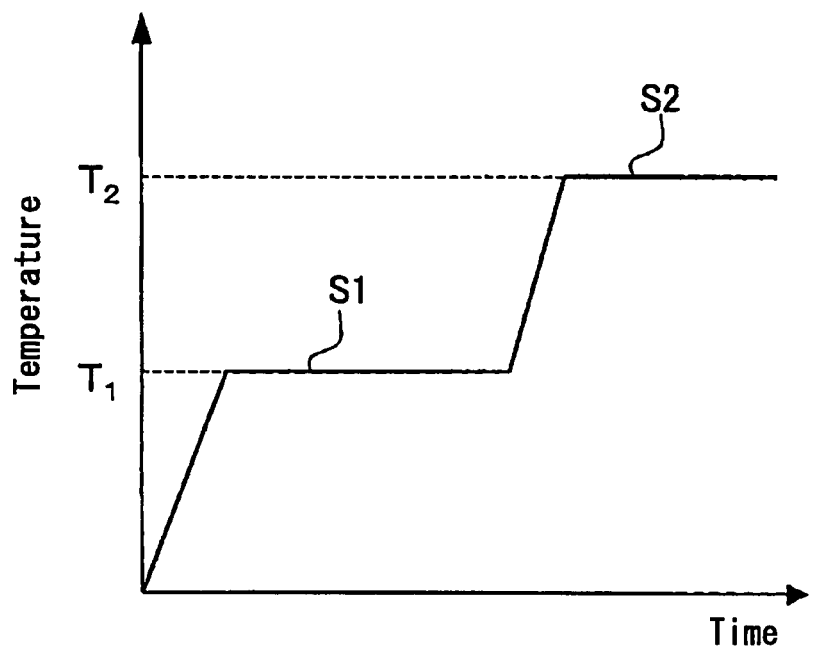
FIG. 2 shows a temperature profile of a flip-chip mounting process wherein a thermosetting resin is used as a flip-chip mounting resin composition of the present invention.
Figure 3:
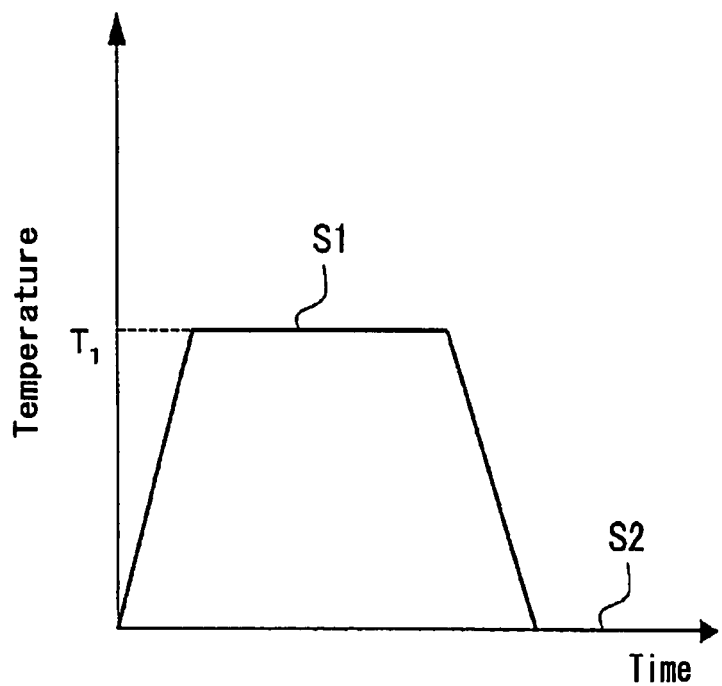
FIG. 3 shows a temperature profile of a flip-chip mounting process wherein a thermoplastic resin is used as a flip-chip mounting resin composition of the present invention.

FIGS. 2 and 3 respectively show temperature profiles of the resin 13, expressed as a function of time in the flip-chip mounting process as shown in FIGS. 1(a) to 1(c). In particular, FIG. 2 shows the temperature profile in a case where a thermosetting resin is used, and FIG. 3 shows the temperature profile in a case where a thermoplastic resin is used.

In the step S1 shown in FIG. 2, the thermosetting resin 13 is heated at the temperature $T_1$. In the course of the S1, the metal particles can melt and the convection additive 12 can boil within the resin 13. The convective movement of the additive 12 serves to forcibly move the molten metal particles. Therefore, while the molten metal particles can aggregate or agglomerate, they can self-assemble into the region between each terminal 11 of the circuit substrate 10 and each terminal 21 of the semiconductor chip 20. As a result, the connection 22 is formed between each terminal 11 and each terminal 21.

Subsequent to the formation of the connections 22, the thermosetting resin 13 is heated up to the temperature $T_2$, and such temperature is kept constant in the step S2. In the course of this heating step, the resin 13 is thermally cured so that the semiconductor chip 20 is secured to the circuit substrate 10, which leads to a completion of the flip chip assembly.

The thermosetting resin 13 may be in any suitable form, e.g., past form or sheet form. In the case of the sheet form, it is preferred that the resin 13 can be softened to be in a molten state at the heating temperature of the step S1. As the sheet-formed thermosetting resin 13, B-staged resin (i.e., partially cured resin) can be used, for example.

Prior to the curing of the thermosetting resin 13 in the step S2, it is needed that the metal particles melt and the convection additive 12 boils within the resin 13 in the course of the step S1. It is therefore preferred that a melting point of the metal particles is lower than a temperature enabling the thermosetting resin 13 to cure, and that a boiling point of the convection additive 12 is lower than the temperature enabling the thermosetting resin 13 to cure.

Figure 4:
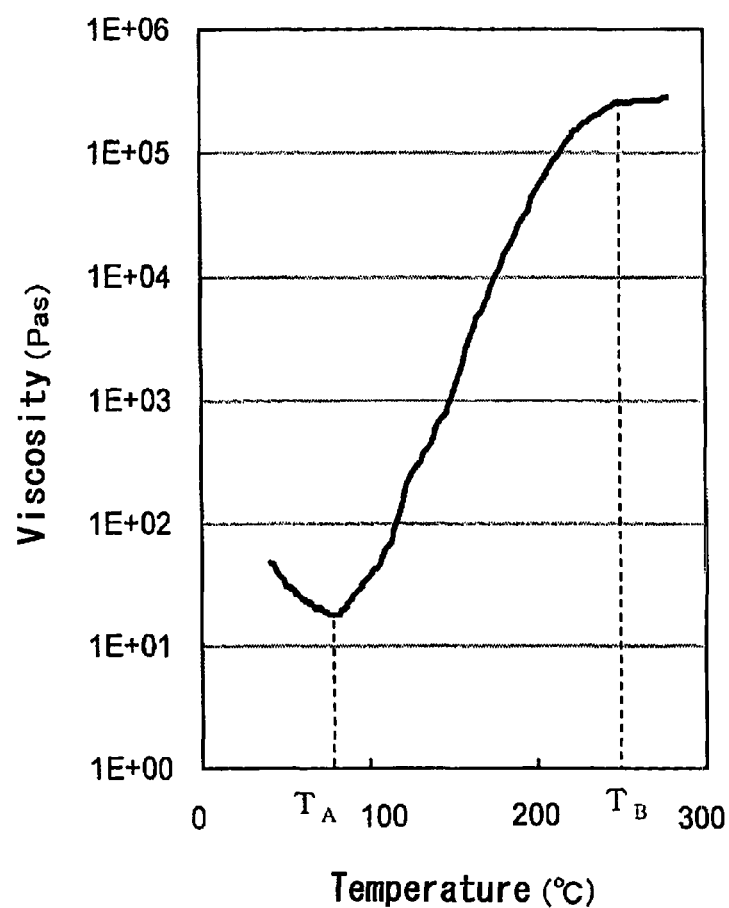
FIG. 4 shows a graph of a correlation between heating temperature and viscosity of a thermosetting resin used for the present invention.

By the way, it is impossible to exactly determine the temperature that enables the thermosetting resin 13 to cure. Furthermore, such temperature generally varies according to the heating rate of the thermosetting resin 13. FIG. 4 shows a graph of a correlation between heating temperature and viscosity with respect to epoxy resin of the representative thermosetting resin. This graph shows the lowest viscosity of the resin at the temperature $T_A$. The viscosity of the resin increases with the increase of the heating temperature, and finally becomes more or less saturated at the temperature $T_B$. It is accordingly preferred that the melting point of the metal particles and the boiling point of the convection additive 12 are between $T_A$ (i.e., reaction-initiating temperature) and $T_B$ (i.e., curing temperature).

In the course of heating the thermosetting resin 13 from a room temperature to the temperature $T_1$ of the step S1, it is preferred that the convection additive 12 boils and convects before the metal particles melt, in which case the unmolten metal particles can gather or accumulate between the terminals, followed by the melting thereof. This leads to an effective self-assembly of the metal particles into the region between the terminals. From this standpoint, it is therefore preferred that the boiling point of the convection additive 12 is lower than the melting point of the metal particles.

Turning to FIG. 3, the temperature profile in a case where the thermoplastic resin is used as a resin 13 will be described. In the step S1, the thermoplastic resin 13 is heated at the temperature $T_1$. Upon this heating, the thermoplastic resin becomes a molten state in which case the metal particles melt and the convection additive 12 boils. The boiling additive 12 can convect within the resin 13, and thereby the molten metal particles are made to be moved forcibly. As a result, the molten metal particles self-assemble while they are aggregating or agglomerating to form the connection 22 between each terminal 11 of the circuit substrate 10 and each terminal 21 of the semiconductor chip 20.

After the connections 22 are formed, the thermoplastic resin 13 is cooled in the step S2 to solidify the resin 13. As a result, the semiconductor chip 20 is secured to the circuit substrate 10, which leads to a completion of the flip chip assembly.

When the metal particles melt before the thermoplastic resin 13 becomes in a molten state upon heating in the step S1, the free movement of the metal particles is impaired in the resin 13. Similarly, when the convection additive 12 boils before the thermoplastic resin 13 becomes in a molten state upon heating in the step S1, the suitable convective movement of the boiling additive 12 is impaired in the resin 13. It is therefore preferred that the metal particles have a melting point higher than a glass transition temperature of the thermoplastic resin 13, and that the convection additive 12 has a boiling point higher than the glass transition temperature of the thermoplastic resin 13. This ensures the effectiveness of the forcible movement of the metal particles, such movement being promoted by the convective movement of the additive 12.

As in the case of the thermosetting resin, in the course of heating the thermoplastic resin 13 from a room temperature to the temperature $T_1$ of the step S1, it is preferred that the convection additive 12 boils and convects before the metal particles melt. In this case, the unmolten metal particles can gather or accumulate between the terminals, followed by the melting thereof. This results in an effective self-assembly of the metal particles into the region between the terminals. From this standpoint, it is therefore preferred that the boiling point of the convection additive 12 is lower than the melting point of the metal particles.

The term "flip-chip mounting" used herein and claims is not limited to an embodiment wherein the semiconductor chip 20 is mounted over the circuit substrate 10. Such term includes "face-down mounting" of the opposed substrates which respectively have a plurality of electrodes.

The term "convection", "convect" or "convective" used herein and claims means various movements of the additive. As long as a movement of the boiling additive (contained in the resin 13) gives energy for the metal particles (which are dispersed in the resin 13) to enhance the mobility of the metal particles, such movement shall be included in "convection", "convect" or "convective", regardless of what kind of embodiment such movement has.

By the way, in a case where a flip chip assembly is manufactured by the flip-chip mounting process using the flip-chip mounting resin composition, it is preferred that the metal particles are prevented from being left to remain in the outside region of the connection formed between each terminal 11 of the circuit substrate 10 and each terminal 21 of the semiconductor chip 20. Especially when the electrode terminals 21 of the semiconductor chip 20 have fine-pitch arrangement, the residual metal particles remaining in such outside region will not only cause a deteriorating of electrical insulating properties at the region between the neighboring electrical connections, but also cause a short-circuit. Therefore, the avoidance of such residual metal particles is crucial for preventing the lowering of reliability and process yield.

The convection additive 12 contained in the resin 13 of the flip-chip mounting resin composition of the present invention serves to forcibly move the metal particles (which are dispersed in the resin 13). Therefore, the metal particles can self-assemble more effectively into the region between the terminals than a case where the metal particles self-assemble only due to "wettability". According to the present invention, it is possible to avoid adding excess metal particles to the resin 13. This means that each connection 22 can be formed between the terminals from an optimum amount of the metal particles. It is therefore possible to reduce the residual metal particles that are left in the outside region of the connection 22 located between the terminals. As a result, it is possible to prevent the short-circuit as well as the deterioration of the electrical insulating properties at the region between the neighboring connections.

The optimum content of the metal particles contained in the flip-chip mounting resin composition of the present invention can be roughly determined as follows.

From an assumption that all the metal particles contained in a volume $V_B$ of the resin composition supplied between the circuit substrate 10 and the semiconductor chip contributes to the formation of the connections 22 between the electrodes of the substrates (e.g., between the connecting terminals 11 of the circuit substrate 10 and the electrode terminals 21 of the semiconductor chip 20), the following relational formula (1) is supposed to hold for a total volume $V_A$ of the connections 22 and the volume $V_B$ of the resin composition:

$$V_A : V_B \approx S_A : S_B \tag{1}$$

In the relational formula (1), $S_A$ is a total surface area of the electrodes of the substrate, and $S_B$ is the surface area of the substrate.

Then, the content of the metal particles contained in the resin composition is given by the following formula (2):

$$\text{Content of metal particles}(\%\text{ by volume}) = S_A/S_B \times 100 \tag{2}$$

In fact, all the metal particles might necessarily not self-assemble into the region between the electrodes of the substrates, and thus there might be some residual metal particles.

Moreover, as long as the electrodes of one substrate are electrically connected to the electrodes of the other substrate with a specific requirement, there is no need to completely fill the connection 22 between each electrode of the one substrate and each electrode of the other substrate.

Therefore, the optimum content of the metal particles contained in the resin composition is estimated by the following formula (3):

$$\text{Content of metal particles}(\% \text{ by volume}) = [(S_A/S_B \times 100) \pm \alpha] \quad (3)$$

In the formula (3), ±α is a parameter for adjusting excess or shortage in quantity of the metal particles when they self-assemble into the region between the electrodes of the substrates. The value of ±α can be determined in accordance with various conditions. For example, in a case where the resin 13 has a low fluidity (i.e., high viscosity), a free movement of the metal particles is impeded in the resin 13, which will lead to a lower proportion of the metal particles that can self-assemble into the region between the electrodes. In this case, it is therefore preferable to increase the quantity of the metal particles contained in the resin 13 (α has a positive value) to compensate for the shortage. The self-assembling of the metal particles may be affected by the convective effect of the convection additive 12 and the wettability of the electrodes.

In a case where each connection 22 is completely filled between the electrodes, the electrical resistance of the connection 22 decreases as the surface area of the electrodes increases on the premise that the distance between the substrates remains unchanged. Therefore, in a case where the surface area of the electrodes is relatively large, there is no need to completely fill the connection 22 between the electrodes as long as a satisfactory electrical conduction is obtained. In this case, it is preferable to determine the quantity of the metal particles contained in the resin composition by preliminarily considering the excess amount of the metal particle, i.e., by estimating "−α".

In this way, ±α (α is parameter for adjusting excess or shortage in quantity of the metal particles when they self-assemble into the region between the electrodes) can be determined by various conditions. For the original purpose of preventing the electrical insulating properties and the like from deteriorating, value of α is preferable to set in the range of ±10% by volume, and more preferably in the range of ±5% by volume.

Figure 5:
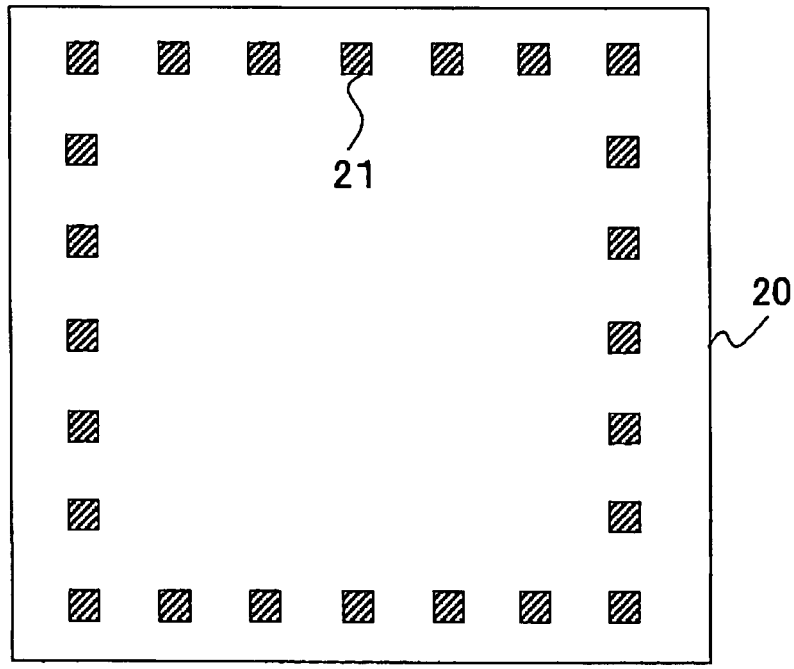
FIG. 5 shows a top plan view illustrating peripheral arrangement of electrode terminals of a semiconductor chip according to the present invention.
Figure 6:
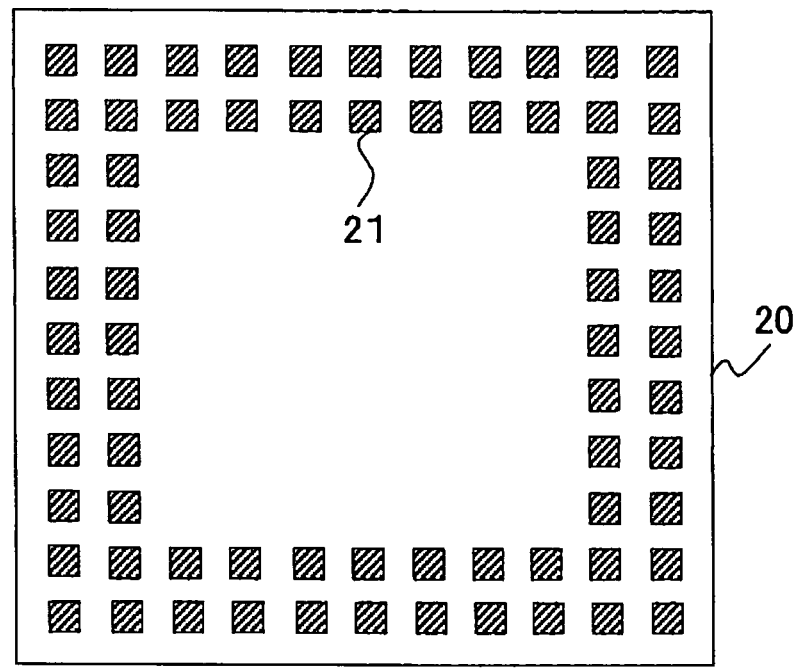
FIG. 6 shows a top plan view illustrating area array arrangement of electrode terminals of a semiconductor chip according to the present invention.
Figure 7:
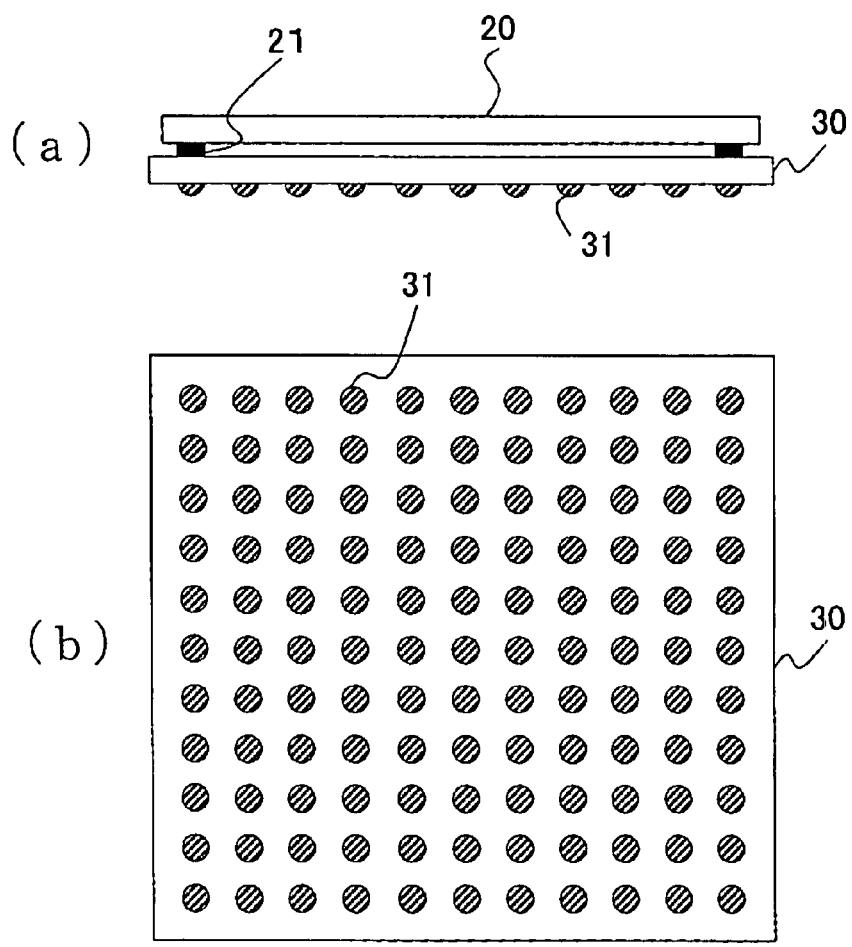
FIG. 7(a) shows a cross-sectional view illustrating the construction of an interposer over which a semiconductor-chip is mounted according to the present invention.
FIG. 7(b) shows a bottom plan view illustrating an arrangement of electrode terminals (lands) of the interposer.

The electrode terminals 21 of the semiconductor chip 20 may be disposed in various arrangement, depending on a performance or application of the semiconductor chip 20. According to such arrangement of the electrode terminals, the optimum content of the metal particles is determined by the formula (3). FIGS. 5 to 7 respectively show top plan views illustrating representative arrangements of the electrode terminals 21 of the semiconductor chip 20.

FIG. 5 shows a so-called "peripheral" semiconductor chip wherein a plurality of electrode terminals 21 are arranged along a peripheral region of the semiconductor chip. FIG. 6 shows the semiconductor chip wherein a plurality of electrode terminals 21 are fine-pitch arranged in lattice form (particularly two-row form) on the surface thereof. In a case where the semiconductor chip 20 is high-density mounted over the circuit substrate, the semiconductor chip 20 that has been provided on the interposer 30 is often mounted over the circuit substrate, as shown in FIGS. 7(a) and 7(b). FIG. 7(a) shows a cross-sectional view illustrating the embodiment wherein the semiconductor chip 20 is provided on the interposer 30. FIG. 7(b) shows a bottom plain view of the interposer 30 wherein the electrode terminals (lands) 31 are arranged in lattice form.

In a case where the electrode terminals 21 of the semiconductor chip 20 (and the electrode terminals of the interposer 30) are representatively arranged as shown in FIGS. 5 to 7, the optimum content of the metal particles is determined by the formula (3) as follows (the following values are rough estimation since they vary according to the pad area and the clearance gap formed between the pads while the arrangement of electrode terminals 21 remains unchanged):

In a case of the first arrangement wherein the electrode terminals of the semiconductor chip are arranged as shown in FIG. 5, the optimum content of the metal particles ranges from 0.5 to 5% by volume;

In a case of the second arrangement wherein the electrode terminals of the semiconductor chip are arranged as shown in FIG. 6, the optimum content of the metal particles ranges from 5 to 15% by volume.

In a case of the third arrangement wherein the electrode terminals of the interposer including the semiconductor chip are arranged as shown in FIG. 7, the optimum content of the metal particles ranges from 15 to 30% by volume.

Thus, in the case where the flip-chip mounting resin composition of the present invention is used for the flip-chip mounting process of producing the flip chip assembly as shown in FIGS. 1(a) to 1(c), it can be concluded that will be sufficient for the resin 13 to have the metal particle content of between 0.5 and 30% by volume. It will be understood that such lower content of the metal particle is achieved by the convective effect of the convection additive 12 dispersed in the resin 13. It will be also understood that such convective effect can reduce the amount of surplus metal particles that have been left to remain in the outside of the region located between the terminals, which will lead to the prevention of the deteriorating of electrical insulating properties as well as short-circuit at the region between the neighboring connections.

Considering that the ratio (by weight) of the metal particles to the resin 13 is generally about 7, the content of between 0.5 and 30% by volume is approximately equivalent to the content of between 4 and 75% by weight.

Figure 16:
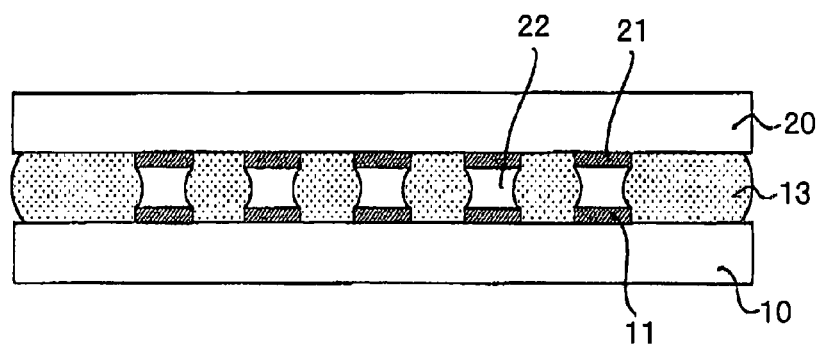
FIG. 16 shows a cross-sectional view of electrical connections obtained by using a flip-chip mounting resin composition of the present invention.

In a case where the content of the metal particles contained in the resin 13 ranges from 0.5 to 20% by volume, each of the obtained connections 22 tends to have a hand-drum-like shape (i.e., TSUZUMI-like shape), which will lead to a high reliability of the connections 22 (see FIG. 16). It will be noted that the content of between 0.5 and 20% by volume is approximately equivalent to the content of between 4 and 65% by weight, considering that the ratio (by weight) of the metal particles to the resin 13 is generally about 7.

FIGS. 8 to 11 show representative materials available as an essential component of the flip-chip mounting resin composition of the present invention. In particular, FIG. 8 shows the representative materials of the thermosetting resin. FIG. 9 shows the representative materials of the thermoplastic resin. FIG. 10 shows the representative materials of the metal particles. FIG. 11 shows the representative materials of the convection additive. For example, as the convection additive, isopropyl alcohol, butyl acetate, butyl carbitol, ethylene glycol or the like can be used. The content of the convection additive contained in the resin, but is not limited to, preferably ranges from 0.1 to 20% by weight.

The reactive diluents (which is partially reacted with the resin and is incorporated into the resin) as listed in the table of FIG. 12 are capable of boiling and thus serve as the convection additive.

The tables shown in Figures indicate parameters of the material characteristics (i.e., glass transition temperature of resin, melting point of metal particle and boiling point of convection additive). Based on these parameters, it is possible to appropriately choose and combine the materials to form the flip-chip mounting resin composition of the present invention such that they are suitable for the temperature profiles shown in FIG. 2 or 3. It will be noted that, as described above, the parameters of the thermosetting resin can vary according to the reaction-initiating temperature, the curing temperature and the temperature-increasing rate, and therefore they are not listed. It will be also noted that the present invention is not limited to the materials listed in the tables shown in Figures.

Embodiment 2

The flip-chip mounting resin composition of the present invention is characterized in that the resin used as a main component comprises the convection additive. That is to say, the present invention has a technical significance in that, upon heating of the resin, the boiling convection additive is allowed to convect within the resin, and thereby the movement of the metal particles (which are dispersed in the resin) is promoted. Such technical significance is provided by the boiling phenomenon of the convection additive, and accordingly the present inventors have studied alternative materials (i.e., convection additive) that can give rise to the similar phenomenon. As a result, the following matters have been found:

When some material capable of generating a gas upon heating of the resin is used, the convective movement of the gas serves to promote the movement of the metal particles (which are dispersed in the resin). This means that the convective movement of such gas can be identified as the convective movement of the convection additive itself.

According to this Embodiment 2, the flip-chip mounting resin composition of the present invention comprises a resin as a main component, metal particles dispersed in the resin, and a convection additive contained in the resin wherein the convection additive is capable of generating a gas upon heating of the resin. This resin composition can be used for the flip-chip mounting process as shown in FIGS. 1(a) to 1(c), in which case, upon the heating the resin, the metal particles are allowed to melt within the resin, and also the gas generated from the convection additive is allowed to convect within the resin.

As the convection additive capable of generating a gas upon heating of the resin, a crystallization water-containing compound, a compound that can be thermally decomposed or a blowing agent can be used. The representative examples are shown in FIG. 13. The materials listed in the table of FIG. 13 can be decomposed to generate a gas such as $H_2O$, $CO_2$ or $N_2$ when being heated.

With respect to the flip-chip mounting resin composition according to Embodiment 2, the materials other than the convection additive are not basically different from those described regarding Embodiment 1. Therefore, the resin composition of Embodiment 2 can be formed by appropriately choosing the resin and the metal particles from the tables of FIGS. 8 to 10, and appropriately choosing the convection additive from the table of FIG. 13.

Embodiment 3

In the above Embodiments 1 and 2, the boiling convection additive itself (contained in the resin) or the gas generated from the convection additive can convect within the resin to provide the promoted movement of the metal particles (which are dispersed in the resin). Such promoted movement of the metal particles can be provided when the resin is polymerized to generate a gas. This means that there is no need to use the convective additive.

Polyester-based resin (e.g., PET), polyamide-based resin (e.g., nylon), polyimide-based resin (e.g., polyimide) or the like can generate $H_2O$ gas when a polymerization process thereof is carried out under a heating condition. Therefore, upon heating of such resin that contains the metal particles, the gas can be generated from the resin when the metal particles melt. The convective movement of the gas generated from the resin serves to promote the movement of the metal particles This means that the convective movement of such gas can be identified as the convective movement of the convection additive itself.

Embodiment 4

The resin composition of the present invention can be not only used for the flip-chip mounting process as shown in FIGS. 1(a) to 1(c), but also used for a bump forming process wherein the bumps are formed on the electrodes of the substrate.

Turning now to FIGS. 14(a) to 14(d), an embodiment wherein a bump forming resin composition of the present invention is used for the bump forming process will be described in more detail.

Figure 14:
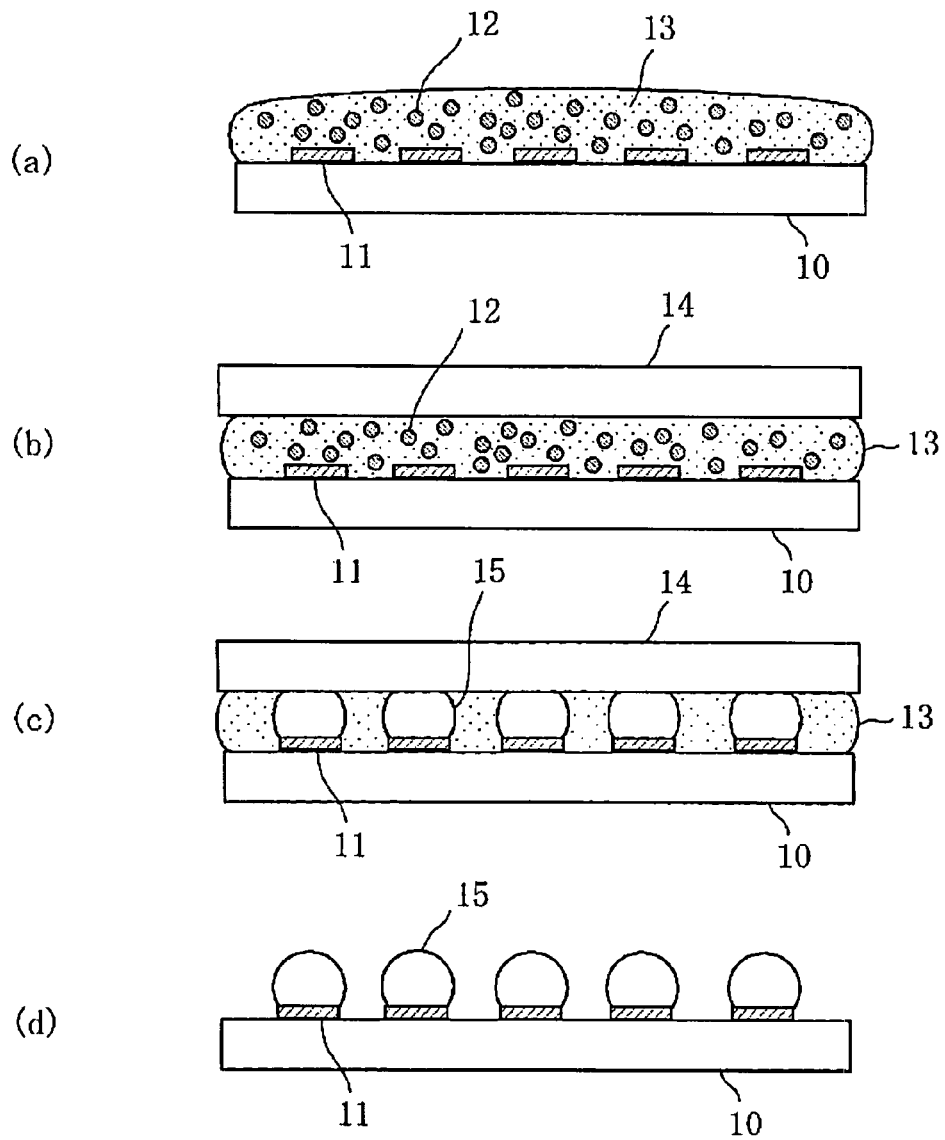
FIGS. 14(a) to 14(d) show cross-sectional views illustrating the steps in a flip-chip mounting process using a resin comprising a convection additive.

As shown in FIG. 14(a), the bump forming resin composition is supplied onto a substrate 10 on which a plurality of electrodes 11 are formed. This bump forming resin composition comprises a resin 13, metal particles (not shown) dispersed in the resin 13, and a convection additive 12 contained in the resin. Upon heating of the resin, the convection additive 12 can boil so that the boiling additive 12 can convect within the resin 13, and also the metal particles can melt within the resin 13.

Next, as shown in FIG. 14(b), a flat plate 14 is brought into contact with a surface of the supplied resin 13. Subsequently, the resin 13 is heated at a temperature higher than a melting point of the metal particles and a boiling point of the convection additive 12.

As a result of the heating, the molten metal particles are allowed to self-assemble onto electrodes 11 having high wettability while a uniform aggregation or agglomeration of the metal particles proceeds within the resin 13 (see FIG. 14(c)). This results in a formation of the bumps 15 that are provided on the electrodes 11 of the substrate 10.

Finally, by removing the flat plate 14 away from the surface of the supplied resin 13, followed by removing the supplied resin 13, the substrate 10 having the bumps 15 formed on the electrodes 11 thereof is obtained as shown in FIG. 14(d). This substrate 10 having the bumps 15 formed thereon can be mounted over another substrate by a conventional flip-chip mounting process.

According to the bump forming process, the convection additive 12 contained in the resin 13 boils upon the heating, so that the boiling convection additive 12 can convect within the resin 13. The convective movement of the additive promotes the movement of the molten metal particles in the resin 13, which leads to a uniform aggregation or agglomeration of the molten metal particles. As a result, the molten metal particles can grow uniformly and self-assemble onto electrodes 11 due to high wettability thereof. This results in a high uniformity of the formed bumps 15 that are provided on the electrodes 11. It will be noted that the keeping the flat plate 14 in contact with the surface of the supplied resin 13 prevents the boiling convection additive 12 from escaping to the outside through the surface of the supplied resin 13.

Basically, the constituent materials of the bump forming resin composition according to Embodiment 4 can be the same as those of the flip-chip mounting resin composition according to Embodiments 1 and 2. It will be however noted that the supplied resin 13 is finally removed in the bump forming process, and thus the curing characteristics of the resin is not required in the bump forming process. In other words, there is no need to add the curing agent to the resin in the case of the bump forming resin composition. The resin may be in any suitable form such as viscous solid (for example oil) that has appropriate viscosity and thus the metal particles and the convection additive can be dispersed therein. From the standpoint of an easy removal of the supplied resin 13, some resin that becomes in a dissolved state upon exposure it to light may be used.

As in the case of the flip-chip mounting resin composition, it is preferred that the content of the metal particles contained in the resin 13 ranges from 0.5 to 30% by volume with respect to the bump forming resin composition of Embodiment 4. In a case where the content of the metal particles contained in the resin 13 ranges from 0.5 to 20% by volume, each of the formed bumps 15 tends to have a hand-drum-like shape, which will lead to a high reliability of the bumps 15.

EXAMPLES

Example 1

Figure 15:
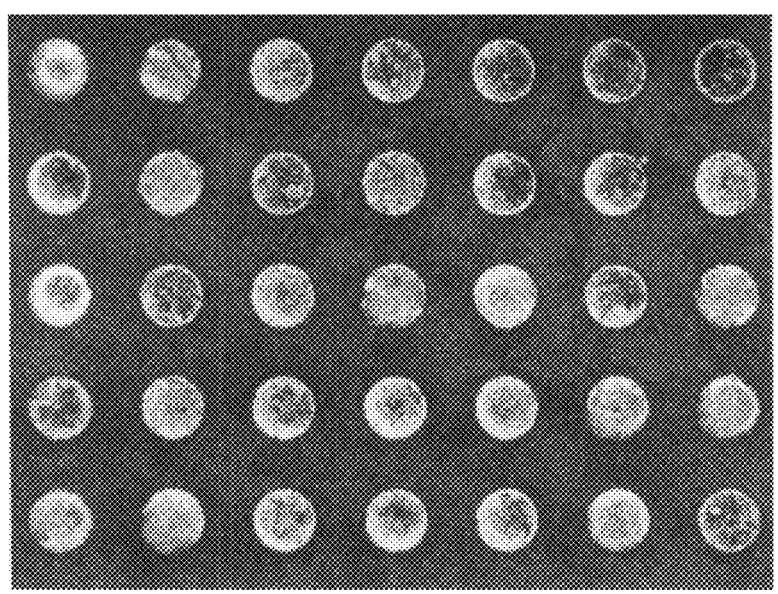
FIG. 15 shows a micrograph of the substrate obtained from the example of the present invention.

The resin composition comprising the following constituent materials was prepared wherein the metal particles and the convection additive were contained in the resin:
Resin: Epikote806 (Japan Epoxy Resins Co., Ltd., Bisphenol F type epoxy-based resin)
Metal particles: SnAgCu (Diameter: 10-25 μm), 40% by weight (8% by volume)
Convection additive: Isopropyl alcohol (KANTO CHEMICAL CO., INC) 3% by weight This resin composition was supplied onto 7 mm×7 mm substrate (electrode area: 300μϕ, electrode number: 165), and subsequently the substrate was heated at 250° C. for 30 seconds. After that, the self-assembling characteristic of the metal particles onto the electrodes was evaluated. FIG. 15 shows a micrograph of the substrate surface from which the resin composition has been removed. As shown in FIG. 15, it was confirmed that the metal particles had self-assembled onto all the electrodes, and that there is no metal particles left to remain in the outside region of the electrodes.

Example 2

The resin composition comprising the following constituent materials was prepared wherein the metal particles and the convection additive were contained in the resin:
Resin: Methylphenyl silicone oil KF54 (Shin-Etsu Chemical CO., Ltd, silicone-based resin)
Metal particles: SnAg (Diameter: 10-15 μm), 35% by weight (7% by volume)
Convection additive: Butyl acetate (KANTO CHEMICAL CO., INC), 3% by weight This resin composition was supplied onto 7 mm×7 mm substrate (electrode area: 300μϕ, electrode number: 165), and subsequently the substrate was heated at 250° C. for 30 seconds. After that, the self-assembling characteristic of the metal particles onto the electrodes was evaluated. The result was the same as that of Example 1. That is to say, it was confirmed that the metal particles had self-assembled onto all the electrodes, and that there is no metal particles left to remain in the outside region of the electrodes.

Example 3

The resin composition comprising the following constituent materials was prepared wherein the metal particles and the convection additive were contained in the resin:
Resin: Epikote806 (Japan Epoxy Resins Co., Ltd., Bisphenol F type epoxy-based resin)
Metal particles: SnAgCu (Diameter: 10-25 μm), 40% by weight (corresponding to 8% by volume)
Convection additive: Isopropyl alcohol (KANTO CHEMICAL CO., INC), 3% by weight This resin composition was supplied onto 5 mm×5 mm substrate (electrode area: 250μϕ, electrode number: 100), and subsequently the semiconductor chip was mounted over the substrate such that they are aligned with each other. After they were heated at 250° C. for 30 seconds, the self-assembling characteristic of the metal particles onto the electrodes was evaluated.

From the observation of the cross-sectional surface of the obtained flip chip assembly, it was found that each connection 22 has a hand-drum-like shape (i.e., TSUZUMI-like shape) as shown in FIG. 16. The flip chip assembly was evaluated in terms of a connecting reliability. As a result, it was found that there was no problem with a hygroscopicity resistance and a thermal shock resistance for more than 1000 hours.

As described above, the flip-chip mounting resin composition of the present invention can contribute to a uniform formation of the connections. That is to say, the flip-chip mounting resin composition of the present invention is supplied between opposed substrates which respectively have a plurality of electrodes, and upon the heating of the resin composition the convective movement of the boiling convection additive promotes the molten metal particles in the resin. This leads to a uniform self-assembly of the metal particles into the region between each electrode of one substrate and each electrode of the other substrate.

By the way, there has been proposed a flip-chip mounting process using a resin that comprises electrically conductive particles wherein the electrode terminals of the semiconductor chip and the circuit substrate are electrically connected to each other, and at the same time the semiconductor chip is secured to the circuit substrate. For example, see "Patent literature 4" (Japanese Patent Kokai Publication No. 2004-260131), "Non-patent literature 1" (10th Symposium on "Microjoining and Assembly Technology in Electronics" Feb. 5-6, 2004, pp. 183-188) and "Non-patent literature 2" (9th Symposium on "Microjoining and Assembly Technology in Electronics" Feb. 6-7, 2003, pp. 115-120). In this process, the resin comprising the electrically conductive particles is supplied between the circuit substrate and the semiconductor chip, and subsequently the resin is heated. The molten conductive particles are allowed to gather (self-assemble) between the electrode terminals, and then the resin is allowed to cure. As a result, the electrical connection between the semiconductor chip and the circuit substrate, and the securing of the semiconductor chip to the circuit substrate are concurrently achieved.

It is however noted that each process of Patent literature 4 and Non-patent literatures 1 and 2 is hard to uniformly form each connection between electrodes since the gathering (self-assembling) of the conductive particles into the region between electrodes is only due to the wettability of the conductive particles. Although Patent literature 4 describes that the process therein can be applicable to the flip-chip mounting of the semiconductor chip, it fails to describe that the semiconductor chip having a large number of electrodes can be flip-chip mounted with a satisfactory process yield (satisfactory yield ratio).

The present invention provide a flip-chip mounting resin composition that contributes to a satisfactory flip-chip mounting process in terms of the process yield even in a case where the semiconductor chip has a large number of electrodes. Therefore, no literature discloses or suggests the convective additive, such additive being considered to be the feature of the present invention.

Patent literature 4 describes that the dispersibility of the electrically conductive particles contained in the resin depends on the mass ratio of the conductive particles to the resin. In this relation, Patent literature 4 describes that the lowest content of the conductive particles contained in the resin is preferably 20% by volume and above, more preferably 30% by volume and above. This means that the electrically conductive particles are allowed to gather (self-assemble) on electrodes only due to the dispersibility of the particles and wettability. In other words, Patent literature 4 has no concept that the electrically conductive particles dispersed in the resin are made to be forcibly moved by the convective movement of the additive.

The present invention has been hereinabove described with reference to preferred embodiments. It will be however understood by those skilled in the art that the present invention is not limited to such embodiments and can be modified in various ways. For example, although thermosetting resin, thermoplastic resin and the like have been exemplified, photo-setting resin can be similarly used.

The present invention as described above includes the following aspects:

The first aspect: A flip-chip mounting resin composition comprising:
a resin, and
metal particles dispersed in the resin,
wherein the resin is capable of generating a gas upon a polymerization thereof when the resin is heated; and
wherein, upon the heating of the resin, said metal particles melt and said gas generated from the resin convects within the resin.

The second aspect: The flip-chip mounting resin composition according to the first aspect, wherein the content of the metal particles contained in the resin ranges from 0.5 to 30% by volume.

The third aspect: The flip-chip mounting resin composition according to the first aspect, wherein the content of the metal particles contained in the resin ranges from 0.5 to 20% by volume.

The fourth aspect: The flip-chip mounting resin composition according to the first aspect, wherein the resin is in paste form.

The fifth aspect: The flip-chip mounting resin composition according to the first aspect, wherein the resin is in sheet form, and the resin becomes in a molten state upon the heating thereof.

The sixth aspect: The flip-chip mounting resin composition according to the fourth or the fifth aspect, wherein the resin comprises thermosetting resin,
a melting point of the metal particles is between a reaction-initiating temperature of the thermosetting resin and a curing temperature of the thermosetting resin, and
a boiling point of the convection additive is between the reaction-initiating temperature of the thermosetting resin and the curing temperature of the thermosetting resin.

The seventh aspect: The flip-chip mounting resin composition according to the fifth aspect, wherein the resin comprises thermoplastic resin,
a melting point of the metal particles is above a glass transition temperature of the thermoplastic resin, and
a boiling point of the convection additive is above the glass transition temperature of the thermoplastic resin.

The eighth aspect: The flip-chip mounting resin composition according to the fourth aspect, wherein the resin comprises photo-setting resin.

The ninth aspect: The flip-chip mounting resin composition according to any one of the first to the eighth aspects, wherein a boiling point of the convection additive is below a melting point of the metal particles.

The tenth aspect: The flip-chip mounting resin composition according to the first aspect, wherein the content of the convection additive contained in the resin ranges from 0.1 to 20% by weight.

The eleventh aspect: The flip-chip mounting resin composition according to the first aspect, wherein the convection additive is at least one material selected from the group consisting of isopropyl alcohol, butyl acetate, butyl carbitol and ethylene glycol.

The twelfth aspect: The flip-chip mounting resin composition according to any one of the first to the eleventh aspects, wherein the resin composition is supplied between substrates which are opposed to each other, each of the substrates having a plurality of electrodes, and upon the heating of the resin composition the metal particles melt so that the molten metal particles self-assemble into region between each electrode of one of the substrates and each electrode of the other of the substrates to form a connection therebetween.

The thirteenth aspect: The flip-chip mounting resin composition according to the twelfth aspect, wherein the content of the metal particles contained in the resin is defined by the following content percentage:

Content percentage of metal particles(% by volume)=
[(total surface area of electrodes)/(surface area of substrate)×100±10].

The fourteenth aspect: The flip-chip mounting resin composition according to the twelfth aspect, wherein each of the substrates has the plurality of electrodes that are arranged along the periphery of each of the substrates,
the content of the metal particles contained in the resin composition is 0.5% by volume and above.

The fifteenth aspect: The flip-chip mounting resin composition according to the twelfth aspect, wherein each of the substrates has the plurality of electrodes that are arranged in lattice form on a surface of each of the substrates,
the content of the metal particles contained in the resin composition is 5% by volume and above.

The sixteenth aspect: The flip-chip mounting resin composition according to the twelfth aspect, one of the substrates is a circuit substrate, the other of the substrates is a semiconductor chip.

The seventeenth aspect: A bump forming resin composition comprising:
a resin,
metal particles dispersed in the resin, and
a convection additive which is contained in the resin and boils upon heating of the resin
wherein, upon the heating of the resin, the metal particles melt and the boiling convection additive convects within the resin.

The eighteenth aspect: The bump forming resin composition according to the seventeenth aspect, wherein the content of the metal particles contained in the resin ranges from 0.5 to 30% by volume.

The nineteenth aspect: The bump forming resin composition according to the seventeenth aspect, wherein the content of the metal particles contained in the resin ranges from 0.5 to 20% by volume.

The twentieth aspect: The bump forming resin composition according to the seventeenth aspect, wherein the resin is in paste form.

The twenty-first aspect: The bump forming resin composition according to the seventeenth aspect, wherein the resin is in sheet form, and the resin becomes in a molten state upon the heating thereof.

The twenty-second aspect: The bump forming resin composition according to any one of the seventeenth to the twenty-first aspects, wherein the resin composition is supplied onto a substrate which has a plurality of electrodes, and upon the heating of the resin composition the metal particles melt so that the molten metal particles self-assemble onto each electrode of the substrate to form a metal bump on the each electrode.

The twenty-third aspect: A flip-chip mounting or bump forming resin composition comprising:
a resin,
metal particles dispersed in the resin, and
a convection additive which is contained in the resin and generates a gas upon heating of the resin
wherein, upon the heating of the resin, the metal particles melt and the gas generated from the convection additive convects within the resin.

The twenty-fourth aspect: The flip-chip mounting or bump forming resin composition according to the twenty-third aspect, wherein the convection additive comprises a compound that contains crystallization water, upon the heating of the resin, the convection additive is decomposed to generate water vapor.

The twenty-fifth aspect: The flip-chip mounting or bump forming resin composition according to the twenty-third aspect, wherein the convection additive is at least one material selected from the group consisting of aluminum hydroxide, dawsonite, ammonium metaborate, barium metaborate, azodicarbonamide and sodium hydrogen carbonate.

The twenty-sixth aspect: The flip-chip mounting or bump forming resin composition according to the twenty-third aspect, wherein the resin is in paste form or in sheet form.

The twenty-seventh aspect: A flip-chip mounting or bump forming resin composition comprising:
a resin,
metal particles dispersed in the resin, and
a convection additive which is contained in the resin and is polymerized to generate a gas upon heating of the resin
wherein, upon the heating of the resin, the metal particles melt and the gas generated from the convection additive convects within the resin.

The twenty-eighth aspect: The flip-chip mounting or bump forming resin composition according to the twenty-seventh aspect, wherein the resin is at least one resin-selected from the group consisting of polyester-based resin, polyamide-based resin and polyimide-based resin.

INDUSTRIAL APPLICABILITY

According to the present invention, there is provided a flip-chip mounting resin composition which can be used for a flip-chip mounting process that is high in productivity and reliability and thus can be used for a flip-chip mounting of the next-generation LSI.

CROSS REFERENCE TO RELATED PATENT APPLICATION

The present application claims the right of priority of Japanese Patent Application No. 2004-365684 (filed on Dec. 17, 2004, the title of the invention: "FLIP CHIP MOUNTING RESIN COMPOSITION AND BUMP FORMING RESIN COMPOSITION"), the disclosure of which is incorporated herein by reference.

The invention claimed is:

1. A flip-chip mounting resin composition comprising:
a resin,
metal particles dispersed in the resin, and
a convection additive which is contained in the resin and boils upon heating of the resin;
wherein said convection additive is at least one material selected from the group consisting of butyl acetate and butyl carbitol,
wherein, upon the heating of the resin, said metal particles melt and the boiling convection additive convects within the resin,
wherein said resin composition is supplied between substrates which are opposed to each other, each of said substrates having a plurality of electrodes,
and upon the heating of said resin composition the metal particles melt so that molten metal particles self-assemble into a region between each electrode of one of said substrates and each electrode of the other of said substrates to form a connection therebetween, and
wherein the content of said metal particles contained in said resin ranges from 0.5 to 20% by volume and is defined by the following content percentage:

Content percentage of metal particles (% by volume)= [(total surface area of electrodes)/(surface area of substrate×100±10)].

2. The flip-chip mounting resin composition according to claim 1, wherein said resin is in paste form.

3. The flip-chip mounting resin composition according to claim 1, wherein said resin is in sheet form, and said resin becomes molten upon the heating.

4. The flip-chip mounting resin composition according to claim 2, wherein said resin comprises a thermosetting resin,
a melting point of said metal particles is between a reaction-initiating temperature of said thermosetting resin and a curing temperature of said thermosetting resin, and
a boiling point of said convection additive is between the reaction-initiating temperature of said thermosetting resin and the curing temperature of said thermosetting resin.

5. The flip-chip mounting resin composition according to claim 3, wherein said resin comprises a thermoplastic resin,
a melting point of said metal particles is above a glass transition temperature of said thermoplastic resin, and
a boiling point of said convection additive is above the glass transition temperature of said thermoplastic resin.

6. The flip-chip mounting resin composition according to claim 2, wherein said resin comprises a photo-setting resin.

7. The flip-chip mounting resin composition according to claim 1, wherein the content of said convection additive contained in said resin ranges from 0.1 to 20% by weight.

8. The flip-chip mounting resin composition according to claim 1, wherein each of said substrates has the plurality of electrodes that are arranged along the periphery of each of said substrates.

9. The flip-chip mounting resin composition according to claim 1, wherein each of said substrates has the plurality of electrodes that are arranged in lattice form on a surface of each of said substrates.

10. The flip-chip mounting resin composition according to claim 1, wherein one of said substrates is a circuit substrate, and the other of said substrates is a semiconductor chip.

11. A bump forming resin composition comprising:
a resin,
metal particles dispersed in the resin, and
a convection additive which is contained in the resin and boils upon heating of the resin;
wherein said convection additive is at least one material selected from the group consisting of butyl acetate and butyl carbitol,
wherein, upon the heating of the resin, said metal particles melt and the boiling convection additive convects within the resin,
wherein said resin composition is supplied onto a substrate which has a plurality of electrodes, and
upon the heating of said resin composition the metal particles melt so that molten metal particles self-assemble onto each electrode of said substrate to form a metal bump on each electrode, and
wherein the content of said metal particles contained in said resin ranges from 0.5 to 20% by volume and is defined by the following content percentage:

Content percentage of metal particles (% by volume)= [(total surface area of electrodes)/(surface area of substrate×100±10)].

12. The bump forming resin composition according to claim 11, wherein said resin is in paste form.

13. The bump forming resin composition according to claim 11, wherein said resin is in sheet form, and said resin becomes molten upon the heating.

14. A flip-chip mounting or bump forming resin composition comprising:
a resin,
metal particles dispersed in the resin, and
a convection additive which is contained in the resin and generates a gas upon heating of the resin;
wherein said convection additive is at least one material selected from the group consisting of dawsonite, ammonium metaborate, barium metaborate, azodicarbonamide and sodium hydrogen carbonate,
wherein, upon the heating of the resin, said metal particles melt and said gas generated from the convection additive convects within the resin,
wherein said resin composition is:
(a) supplied between substrates which are opposed to each other, each of said substrates having a plurality of electrodes, and
upon the heating of said resin composition the metal particles melt so that molten metal particles self-assemble into a region between each electrode of one of said substrates and each electrode of the other of said substrates to form a connection therebetween, or
(b) supplied onto a substrate which has a plurality of electrodes, and
upon the heating of said resin composition the metal particles melt so that molten metal particles self-assemble onto each electrode of said substrate to form a metal bump on said each electrode, and
wherein the content of said metal particles contained in said resin ranges from 0.5 to 20% by volume and is defined by the following content percentage:

Content percentage of metal particles (% by volume)= [(total surface area of electrodes)/(surface area of substrate×100±10)].

15. The flip-chip mounting or bump forming resin composition according to claim 14, wherein said convection additive comprises a compound which contains crystallization water, and upon the heating of said resin, said convection additive is decomposed to generate water vapor.

16. The flip-chip mounting or bump forming resin composition according to claim 14, wherein said resin is in paste form or in sheet form.

17. A flip-chip mounting or bump forming resin composition comprising:
at least one resin selected from the group consisting of polyamide-based resin and a polyimide-based resin, and
metal particles dispersed in the resin,
wherein the resin is capable of generating a gas upon a curing thereof when the resin is heated,
wherein, upon the heating of the resin, said metal particles melt and said gas generated from the resin convects within the resin,
wherein said resin composition is:
(a) supplied between substrates which are opposed to each other, each of said substrates having a plurality of electrodes, and
upon the heating of said resin composition the metal particles melt so that molten metal particles self-assemble into a region between each electrode of one of said substrates and each electrode of the other of said substrates to form a connection therebetween, or
(b) supplied onto a substrate which has a plurality of electrodes, and
upon the heating of said resin composition the metal particles melt so that molten metal particles self-assemble onto each electrode of said substrate to form a metal bump on said each electrode, and
wherein the content of said metal particles contained in said resin ranges from 0.5 to 20% by volume and is defined by the following content percentage:

Content percentage of metal particles (% by volume)= [(total surface area of electrodes)/(surface area of substrate×100±10)].

* * * * *